(12) United States Patent
Gao

(10) Patent No.: US 11,700,709 B2
(45) Date of Patent: Jul. 11, 2023

(54) REDUNDANT MODULE AND SYSTEMS FOR HIGH DENSITY SERVERS

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 28 days.

(21) Appl. No.: 17/384,434

(22) Filed: Jul. 23, 2021

(65) Prior Publication Data

US 2023/0025167 A1     Jan. 26, 2023

(51) Int. Cl.
*H05K 7/20* (2006.01)

(52) U.S. Cl.
CPC ......... *H05K 7/20254* (2013.01); *H05K 7/208* (2013.01); *H05K 7/20763* (2013.01); *H05K 7/20772* (2013.01); *H05K 7/20809* (2013.01)

(58) Field of Classification Search
CPC ........... H05K 7/20254; H05K 7/20318; H05K 7/20772; H05K 7/20809
See application file for complete search history.

(56) References Cited

U.S. PATENT DOCUMENTS

| | | | | |
|---|---|---|---|---|
| 5,920,457 A | * | 7/1999 | Lamb | H01L 23/473 257/E23.098 |
| 6,065,208 A | * | 5/2000 | Lamb | H01L 23/473 257/E23.098 |
| 6,111,749 A | * | 8/2000 | Lamb | H01L 23/473 361/752 |
| 8,081,463 B2 | * | 12/2011 | Chiu-Mao | H05K 7/20218 174/15.1 |
| 8,157,001 B2 | * | 4/2012 | Hom | H05K 7/20281 165/300 |
| 8,422,231 B2 | * | 4/2013 | Huang | H05K 7/20218 361/709 |
| 10,014,239 B2 | * | 7/2018 | Takemura | H01L 23/42 |
| 10,477,725 B2 | * | 11/2019 | Chen | F28D 15/00 |
| 10,827,649 B2 | * | 11/2020 | Lunsman | H05K 7/20927 |
| 10,888,031 B2 | * | 1/2021 | Franz | G06F 1/185 |
| 10,966,354 B1 | * | 3/2021 | Shao | F28D 15/00 |
| 11,019,752 B2 | * | 5/2021 | Gao | H05K 7/20272 |
| 11,547,022 B2 | * | 1/2023 | Gao | H05K 7/20272 |
| 2019/0098798 A1 | * | 3/2019 | Franz | H05K 7/20509 |
| 2020/0003497 A1 | * | 1/2020 | Aston | H01L 23/473 |

* cited by examiner

*Primary Examiner* — Robert J Hoffberg
(74) *Attorney, Agent, or Firm* — Womble Bond Dickinson (US) LLP

(57) ABSTRACT

The disclosure provides a cooling device, for cooling devices that generate heat during their operation. The cooling device includes single phase cooling plates to be attached to the devices to dissipate a majority of the heat from the devices while a first coolant is circulated through the single phase cooling plates. The cooling device also includes a unified cooling plate. The plate is directly attached on top of the single phase cooling plates. The unified cooling plate dissipates a portion of the heat transferred from the single phase cooling plates to the unified cooling plate while a second coolant is circulated through the unified cooling plate and when the first coolant is insufficient to remove the portion of the heat from at least one of the single phase cooling plates. The cooling device may be used as part of an electronic rack, a data center, and in other environments.

20 Claims, 12 Drawing Sheets

REDUNDANT MODULE AND SYSTEMS FOR HIGH DENSITY SERVERS

FIELD OF THE INVENTION

Embodiments of the present invention relate generally to data center and server cooling. More particularly, embodiments of the invention relate to cooling devices using multiple types of coolants.

BACKGROUND

Cooling is a prominent factor in a computer system and data center design. The number of high performance electronics components and devices such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers. In addition, redundant is a main design consideration especially for mission critical applications.

Many cooling solutions focus on large scale system level cooling. For example, data centers may be designed to facilitate large scale distribution of airflow for cooing purposes. The distributed airflow may be funneled through aisles and into where the processors or other electronics components are positioned. Generally, one stream of airflow may be directed towards each of these components. If a source of the airflow fails to continue to provide the airflow, the electronics devices may be impacted due to increased temperatures for lack of cooling.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
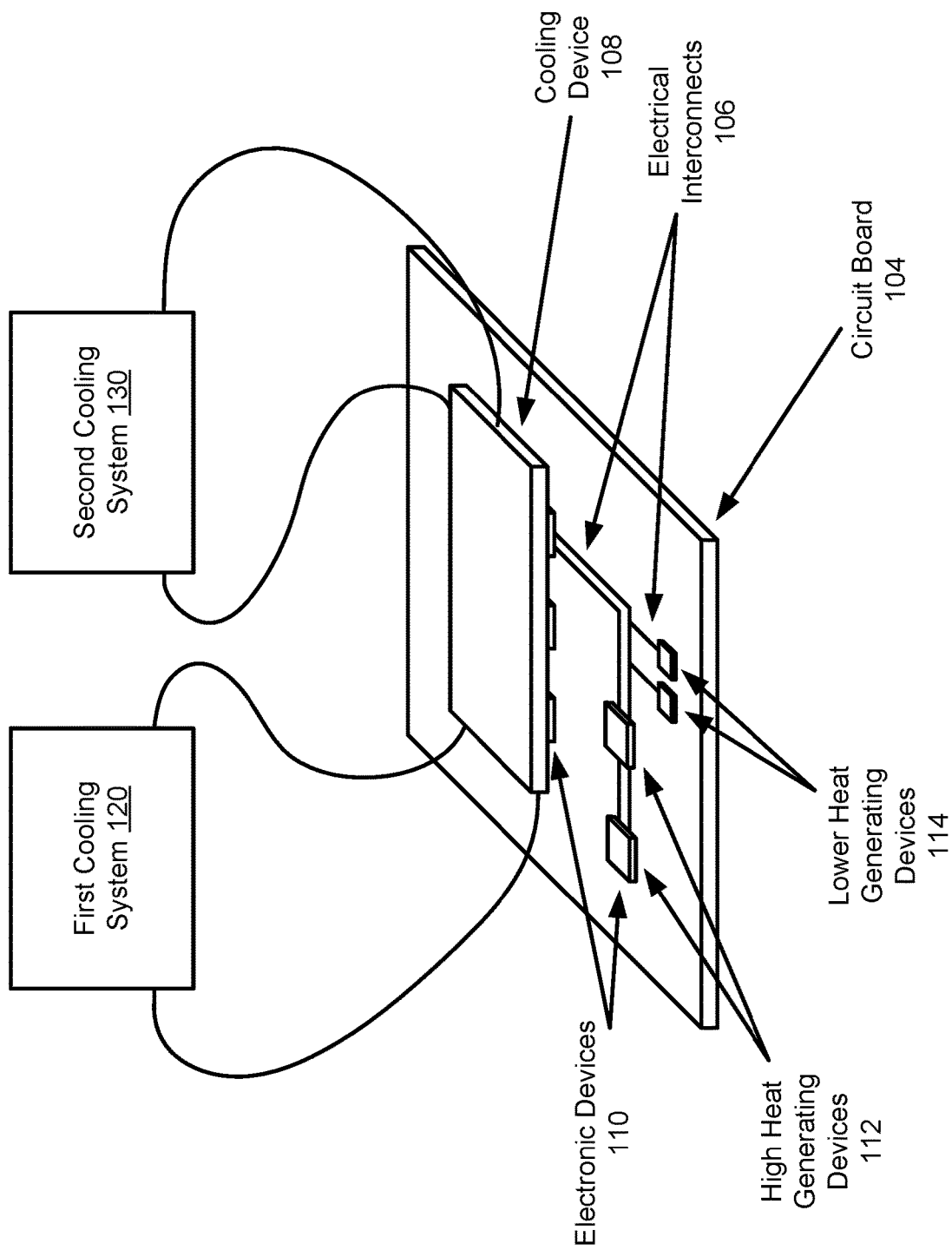
FIG. 1 shows a diagram of a system according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In general, embodiments disclosed herein provide methods, systems, and devices for cooling devices (or components thereof) in a computing environment such as a data center. The disclosed methods and systems may provide for a high degree of cooling reliability. To provide for cooling reliability, multiple redundant fluid flows may be used to cool various hardware devices. By utilizing multiple redundant fluid flows to cool devices, the hardware devices may continue to be cooled even when faced with multiple sources of failure that reduce the effectiveness of the fluid flows. To provide for this level of redundancy, the systems and methods disclosed herein may provide for component or module level cooling redundancy. This level of redundancy may provide for continued operation of computing devices even when faced with failure in a variety of cooling systems.

To provide for cooling redundancy, a cooling device in accordance with embodiments disclosed herein includes single phase cooling plates attachable to devices that generate heat when operating. The single phase cooling plates may dissipate a majority of the heat from the devices when attached to the devices while a first coolant is circulated through the single phase cooling plates. When operating normally, the single phase cooling plates may be designed to dissipate all of the heat from the devices on which they are positioned. However, the single phase cooling plates may not operate normally at all points in time resulting in some heat from the devices not being dissipated by the single phase cooling plates. To provide a level of cooling redundancy, the cooling device may also include a unified cooling plate. The unified cooling plate may be positioned on top of the single phase cooling plates. The unified cooling plate may dissipate a portion of the heat transferred from the single phase cooling plates to the unified cooling plate while a second coolant is circulated through the unified cooling plate and when the first coolant is insufficient to remove the portion of the heat from at least one of the single phase cooling plates.

For example, consider a scenario where the first coolant stops being circulated to the single phase cooling plates. The single phase cooling plates may no longer be capable of dissipating heat (e.g., after their temperatures increase for lack of coolant flow). By being positioned on the single phase cooling plates, the heat may then transfer through the single phase cooling plates to the unified cooling plate, where it may be dissipated with the second coolant circulation.

The single phase cooling plates may be connected to one another as a loop with two ports on different sides of the single phase cooling plates. In this manner, coolant may flow through the single phase cooling plates thereby reducing the complexity of circulating coolant to these plates.

To facilitate deployment of the cooling device, the single phase cooling plates and the loop may be formed as a module. For example, the loop may be formed from structural tubes that interconnects the single phase cooling plates. The structure as a whole may be deployed thereby further easing deployment and/or reducing the necessary quantity of attachment hardware.

Because any of the single phase cooling plates may lose coolant circulation, the unified cooling plate may cover all of the single phase cooling plates. Accordingly, the unified cooling plate may be thermally connected to all of the single phase cooling plates to allow for redundant cooling of any of them in the event of a coolant circulation failure through the single phase cooling plates. The unified cooling plate may include a second loop with two ports. Accordingly, the unified cooling plate and the single phase cooling plates may be part of two separate loops (connected through the respective sets of ports) through which similar or different coolants may be circulated.

A system in accordance with embodiments disclosed herein may also include a first cooling system to circulate the coolant through the single phase cooling plates, and a second cooling system to circulate the second coolant through the unified cooling plate. These separate cooling systems may provide for a level of redundancy in heat dissipation. The cooling devices may still provide cooling while either unit/system is functioning (and in some cases, when neither cooling system is functioning for limited amounts of time).

The second cooling system may be a two phase system and the second coolant may be a two phase coolant, whereas the first cooling system may be a single phase system. The two phase system may circulate the two phase coolant through the unified cooling plate by providing liquid two phase coolant to the unified cooling plate and receiving vaporized two phase coolant from the unified cooling plate. The two phase system may condense the vaporized two phase coolant to resupply with liquid two phase coolant.

The two phase system may include a pump that pumps the two phase coolant to the unified cooling plate, or the two phase system may circulate the two phase coolant to the unified cooling plate through natural convection and/or gravity assisted flow.

In some embodiment, both of the coolants are single phase coolants. Rather than using a two phase coolant, single phase coolants may be circulated through all of the cooling plates, but may be circulated using different fluid recirculation loops for redundancy purposes.

In some cases, the unified cooling plate is also attached to medium power devices (e.g., devices of lower power than the devices to which the single phase cooling plates are attached) to which the single phase cooling plates are not attached. Due to the lower power consumption, these devices may generate less heat thereby only requiring a lesser degree of cooling which may be provided using only the unified cooling plate.

The cooling devices and systems discussed above may be used in a data center environment in which electronic racks that house server chassis may be employed. The cooling devices may be used in one or more of the server chassis to provide for cooling of devices disposed therein. Distribution buses may be utilized to facilitate circulation of coolants in such an environment.

By implementing a system as discussed above, high powered and/or high importance devices may be efficiently cooled. Electronic devices, such as CPU servers, GPU servers, storage servers, networking equipment, edge and mobile system, on-vehicle computing boxes, and other types of devices may be provided with a high degree of cooling certainty thereby increasing their uptime. The system may prevent or limit the impact of single (or multiple) points of failure in cooling systems. By modularizing the components of the system, the system may be quickly and efficiently deployed, and may be capable of easily updating existing hardware without requiring significant modification.

FIG. 1 is a diagram illustrating an example of a device that may be included in a computing environment in accordance with one or more embodiments. The device may, for example, perform computations as part of the computing environment. The computations may enable computer implemented services to be provided to one or more clients (not shown).

The device may generate heat as a byproduct of the computations that it performs for the computer implemented services. For example, the device may include a circuit board 104 (or other type of carrier device) on which one or more electronic devices 110 are attached and/or operably connected (to each other, other devices, and/or sources of electrical power) with electrical interconnects 106 (e.g., wires, traces, etc.). The electronic devices may include computer chips or other electronic devices (e.g., storage devices, power supplies or other power management components, communication components, etc.) that consume electrical to perform (or facilitate performance of) desired computations and generate heat as a byproduct of providing their respective functionalities.

Different electronic devices 110 may consume different quantities of electrical power and/or generate different quantities of heat as a byproduct of their operation. For example, electronic devices 110 may include some high heat generating devices 112 that consume larger amounts of electrical power and generate larger amounts of heat. Electronic devices 110 may also include some lower heat generating devices 114 that consumed lesser amounts of power and generate lesser amounts of heat. Thus, different portions of electronic devices 110 may have different cooling needs.

If the cooling requirements of electronic devices 110 are not met, then all, or a portion, of electronic devices 110 may not provide their respective functionalities. For example, any of electronic devices 110 may (partially or entirely) become inoperable and/or may not operate as expected and/or desired.

In general, embodiments disclosed herein may provide systems, methods, and devices for cooling electronic devices 110. The electronic devices 110 may be cooled by dissipating heat generated by these devices. By dissipating the heat generated by these devices, electronic devices 110 may be more likely to continue to operate (and/or operate in a desired or expected manner). Consequently, a system in accordance with embodiments disclosed herein may provide improved services with a higher uptime, higher responsiveness, and/or other desirable qualities.

To provide for cooling of electronic devices 110, a system in accordance with embodiments disclosed herein includes cooling device 108. Cooling device 108 may be a physical device for dissipating heat from electronic devices 110. Cooling device 108 may be substantially maintained within a temperature range with one or more cooling systems (e.g., 120, 130). For example, cooling device 108 may be fluidly connected to first cooling system 120 and/or second cooling system 130. First cooling system 120 and/or second cooling system 130 may circulate one or more coolants to cooling device 108. The circulating coolants may absorb heat from cooling device 108 and transfer it to the respective cooling system (e.g., 120, 130) for dissipation thereby keeping cooling device 108 within the temperature range. The temperature range may be selected to facilitate thermal transport from various devices to cooling device 108 thereby managing the temperatures of these devices. For additional details regarding the circulation of coolants and the cooling systems, refer to FIGS. 5-6D.

Cooling device 108 may be placed in contact with all, or a portion, of electronic devices 110 to transfer heat from electronic devices to cooling devices 108 thereby cooling electronic devices 110 (e.g., by transferring heat to the cooling systems (e.g., 120, 130) for dissipation). However, cooling capability of cooling device 108 may be limited to when coolants from first cooling system 120 and/or second cooling system 130 are circulated through it. If coolant is not circulated through cooling device 108, cooling device 108 may not be able to cool electronic devices 110.

Embodiments disclosed herein may provide a cooling device 108 which is tolerant to partial suspension of coolant circulation. Cooling device 108 may be tolerant to partial suspension of coolant circulation by utilizing coolant circulated from multiple units/systems. The coolant from these respective units/systems may be kept in separate loops through cooling device 108. By doing so, cooling device 108 may still be able to cool electronic devices 110 when faced with an interruption in the circulation of one of the coolant circulations due to, for example, obstructions in one of the loops, loss of pressure in one of the loops, and/or for other reasons.

Figure 2A:
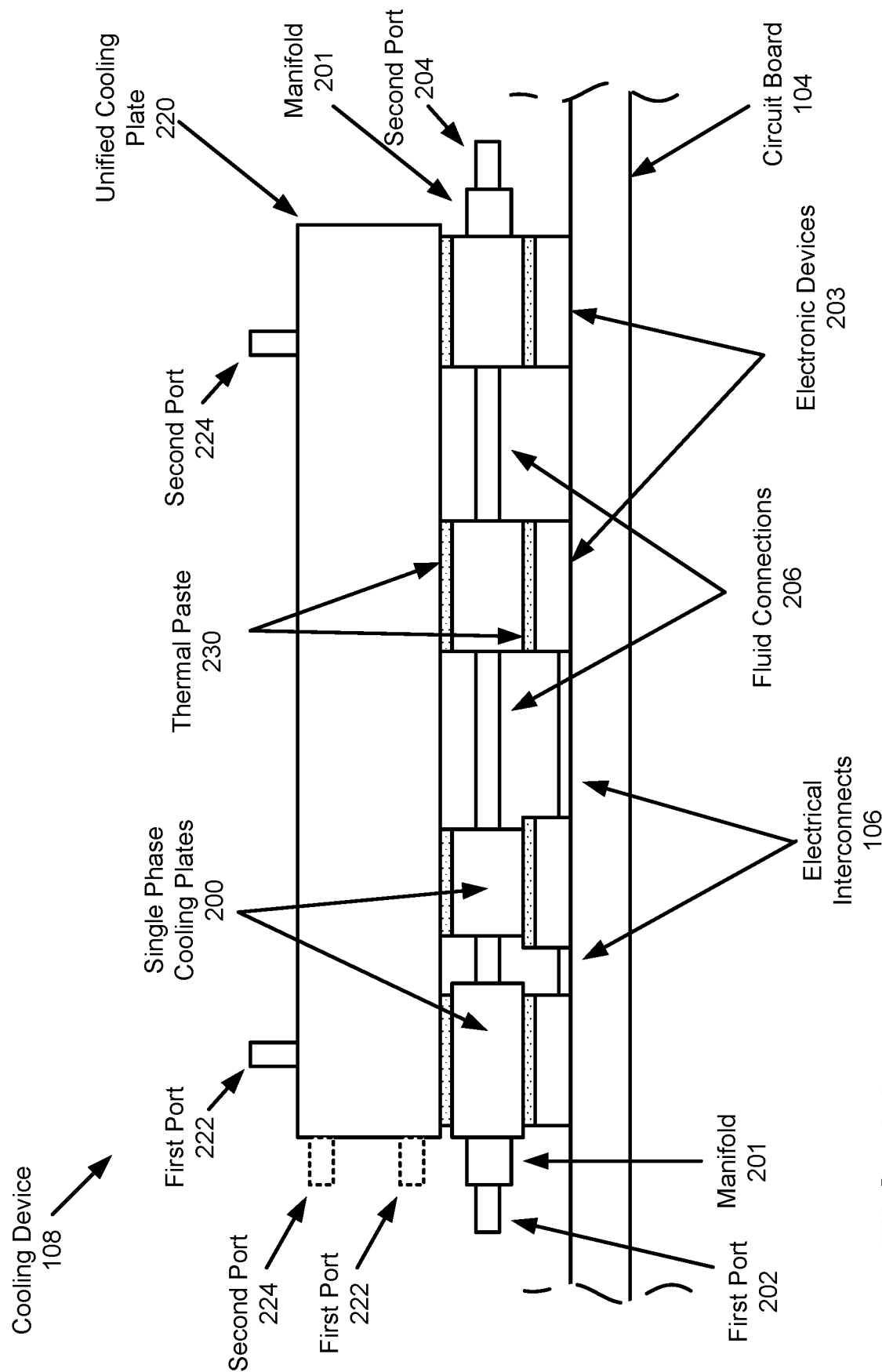
FIG. 2A shows a side view diagram of a cooling device according to one embodiment.

Turning to FIG. 2A a side view diagram of cooling device 108 in accordance with one or more embodiments is shown. To provide for cooling of devices (e.g., electronic devices 203), cooling device 108 may include single phase cooling plates 200 and unified cooling plate 220. Each of these plates may be a physical structure through which coolant may flow to dissipate heat from cooling device 108.

Single phase cooling plates 200 may include any number of cooling plates. The cooling plates may be physical structures for dissipating heat from devices to which the cooling plates are attached.

To dissipate heat, single phase cooling plates 200 may receive a flow of coolant. The coolant may flow through single phase cooling plates 200 to exchange heat. To allow coolant to flow through them, the single phase cooling plates 200 may include hollow interior portions having shapes (e.g., ridges, long path lengths, etc.) that facilitate heat exchange with single phase cooling plates 200. Single phase cooling plates 200 may be formed from, at least in part, a thermally conductive material such as aluminum or another metals. Each of single phase cooling plates 200 may include an inlet port for receiving coolant and an outlet port for exhausting the coolant.

Single phase cooling plates 200 may be fluidly connected to each other with one or more fluid connections 206. The fluid connections 206 may be physical structures such as, for example, pipes, tubes, hollow blocks, plates with a series of hollow portions to place the single phase cooling plates 200 in fluid communication with each other, etc. In one embodiment, single phase cooling plates 200 are arranged as a loop. First port 202 may be fluidly connected to the loop at one end of the loop and second port 204 may be fluidly connected to the loop at the other end of the loop. The loop may include any number of portions connected in serial and/or parallel with one another. For example, the loop may include one or more manifolds (e.g., 202) that facilitate serial and/or parallel fluid connection of single phase cooling plates 200 along the loop.

First port 202 and/or second port 204 may facilitate fluidic connection of the loop to other devices, such as first cooling system 120 (e.g., thereby forming a first closed fluid flow loop). When fluidly connected to first cooling system 120, coolant may be circulated through single phase cooling plates 200. In one embodiment, the coolant circulated through single phase cooling plates 200 is a single phase coolant. The single phase coolant may include, for example, water, alcohols, rheological property modifiers (e.g., surface tension, viscosity, etc.). etc. The single phase coolant additional, fewer, and/or different components without departing from embodiments disclosed herein. The single phase coolant may stay substantially in liquid form as it circulates.

Generally, first port 202 and second port 204 may be disposed on the sides of the single phase cooling plates 200. As will be discussed in greater detail below, unified cooling plate 220 may generally cover the top of the single phase cooling plates 200.

Each of single phase cooling plates 200 may be similar to or different from other single phase cooling plates. For example, each of single phase cooling plates 200 may be of similar or different sizes. For additional details regarding various implementations of single phase cooling plates 200, refer to FIGS. 3A-3D.

In one embodiment, single phase cooling plates 200 are implemented as a single unit. For example, single phase cooling plates 200 may be positioned and/or oriented with respect to one another to correspond to a pattern of electronic devices.

In one embodiment, single phase cooling plates 200 are implemented as a single layer. For example, single phase cooling plates 200 may be positioned, generally and approximately, within a plane so as to facilitate physical placement with respect to electronic devices attached to a circuit board.

While not illustrated in FIG. 2, single phase cooling plates 200 may include attachment hardware usable to position, orient, and/or attach to one or more electronic devices. For example, single phase cooling plates 200 may include attachment hardware usable to attach single phase cooling plates 200 to a circuit card to which electronic devices are attached and, in doing so, press single phase cooling plates 200 against the electronic devices (e.g., to facilitate conduction heat transport from the electronic devices to single phase cooling plates 200).

Unified cooling plate 220 may include a cooling plate. The cooling plate may be sized to cover all, or a portion, of single phase cooling plates 200.

Like single phase cooling plates 200, unified cooling plate 220 may receive a flow of coolant. The coolant may flow through unified cooling plate 220 to exchange heat. To allow coolant to flow through it, unified cooling plate 220 may include hollow interior portions having shapes that facilitate heat exchange with unified cooling plate 220. Unified cooling plate 220 may be formed from, at least in part, a thermally conductive material such as aluminum or another metals. Unified cooling plate 220 may include first port 222 and second port 224, in fluid connection with the hollow interior portion, to enable the coolant to circulate through the hollow interior portions thereby forming a second loop.

First port 222 and/or second port 224 may facilitate fluidic connection of the second loop to other devices, such as second cooling system 130 (e.g., thereby forming a second closed fluid flow loop). When fluidly connected to second cooling system 130, coolant may be circulated through unified cooling plate 220. To facilitate fluidic connections with other devices, first port 222 and/or second port 224 may be disposed on a top side of unified cooling plate 220. However, these ports may be positioned on other surfaces (e.g., side surfaces). An example of positioning these ports on a side of unified cooling plate 220 is illustrated in FIG. 2A with dashed lines to indicate that the ports may be located where illustrated or in other locations illustrated with solid lines.

In one embodiment, the coolant circulated through unified cooling plate 220 is a single phase coolant. The single phase coolant may include, for example, water, alcohols, rheological property modifiers (e.g., surface tension, viscosity, etc.). etc. The single phase coolant additional, fewer, and/or different components without departing from embodiments disclosed herein. The single phase coolant may still substantially in liquid form as it circulates.

In one embodiment, the coolant circulated through unified cooling plate 220 is a two phase coolant. The two phase coolant be received by unified cooling plate 220 in liquid form, evaporate (e.g., vaporize to form a vapor) inside of unified cooling plate 220, and be exhausted in the vaporized form. Consequently, at least one of ports 222, 224 may be a vapor port to provide for return of vaporized coolant to a cooling system.

Generally, unified cooling plate 220 may be positioned on top of single phase cooling plates 200 to cover them (e.g., positioned on a top side of single phase cooling plates 200). Unified cooling plate 220 may be in direct contact with single phase cooling plates 200 and/or a layer of thermal paste 230 may be positioned between unified cooling plate 220 and single phase cooling plates 200.

Similarly, single phase cooling plates 200 may be positioned on top of electronic devices 203 to cover them in part or completely (e.g., positioned on a top side of electronic devices 203). Single phase cooling plates 200 may be in direct contact with electronic devices 203 and/or a layer of thermal paste 230 may be positioned between single phase cooling plates 200 and electronic devices 203.

Unified cooling plate 220 may also be positioned on top of a portion of electronic devices 203 on which no single phase cooling plates 200 are positioned. In this manner, Unified cooling plate 220 may dissipate heat from all of the electronic devices that single phase cooling plates 200 dissipate heat for as well as some additional electronic devices for which single phase cooling plates 200 do not dissipate heat. For additional details, refer to FIG. 3B.

Figure 2B:
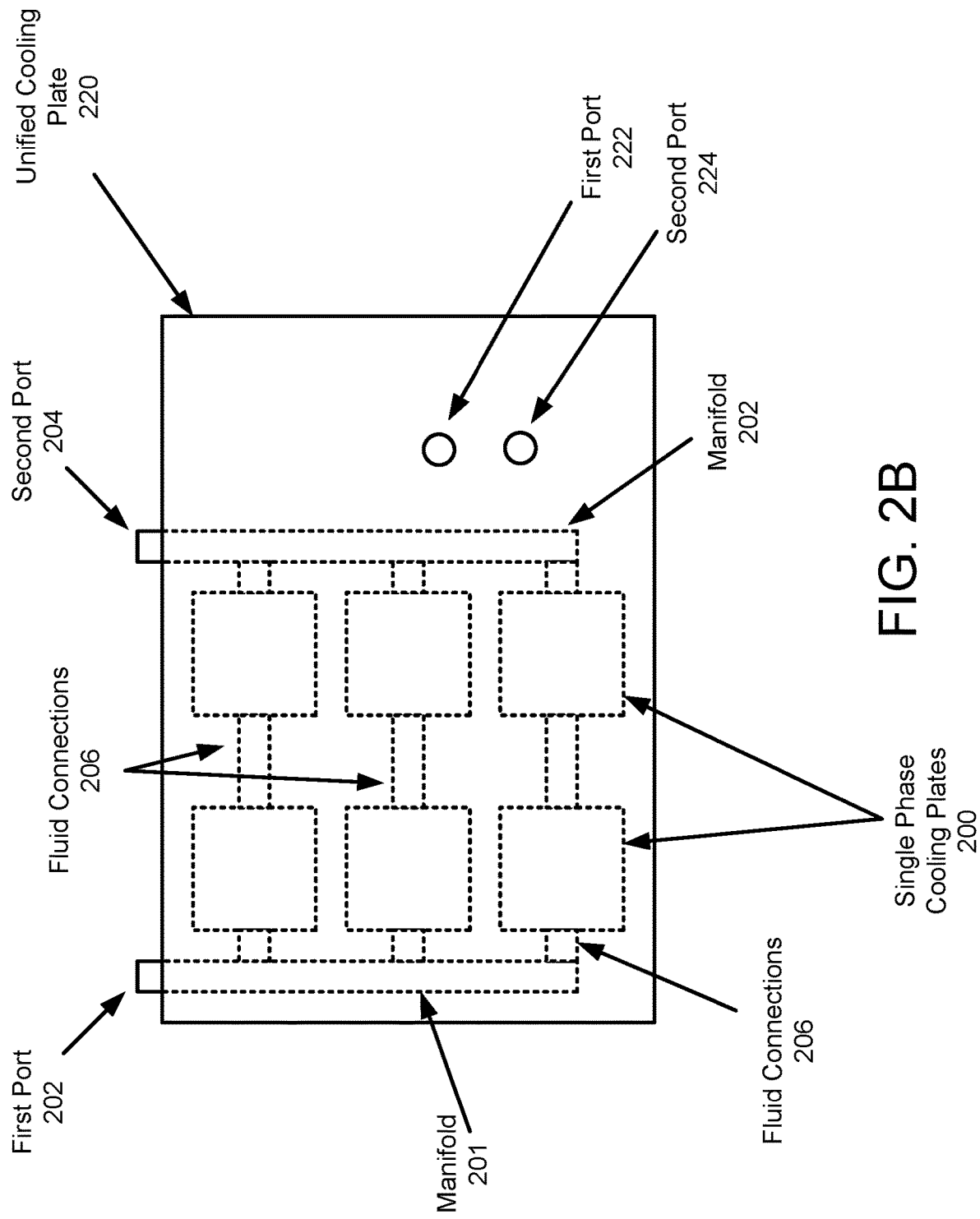
FIG. 2B shows a top view diagram of a cooling device according to one embodiment.

Turning to FIG. 2B, a top view diagram of cooling device 108 in accordance with one or more embodiments is shown. In FIG. 2B, the portions of single phase cooling plates 200, fluid connections 206, and manifold 201 obscured from the top view by unified cooling plate 220 are shown with dashed lines.

As discussed with respect to FIG. 2A, ports 202, 204, 222, 224 may generally be disclosed in various locations. For example, in FIG. 2A, first port 222 and second port 224 are illustrated as being on top of unified cooling plate 220 and extending upwards. Any of these ports may be positioned elsewhere to facilitate connection of the loops through single phase cooling plates 200 and unified cooling plate 220 to other devices to form fluid flow loops through which various coolants may be circulated.

Figure 4A:
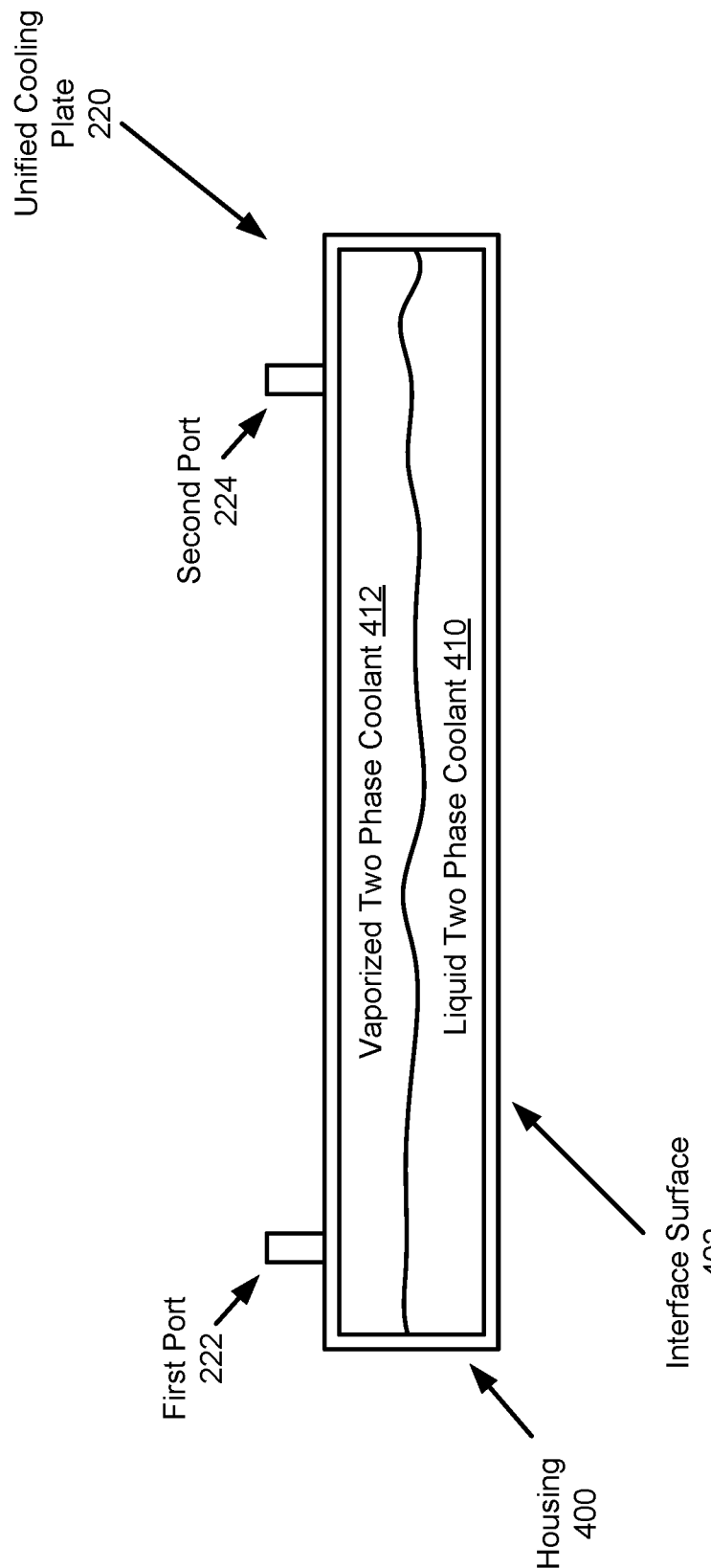
FIG. 4A shows a diagram of a first topology of a unified cooling plate according to one embodiment.
Figure 4B:
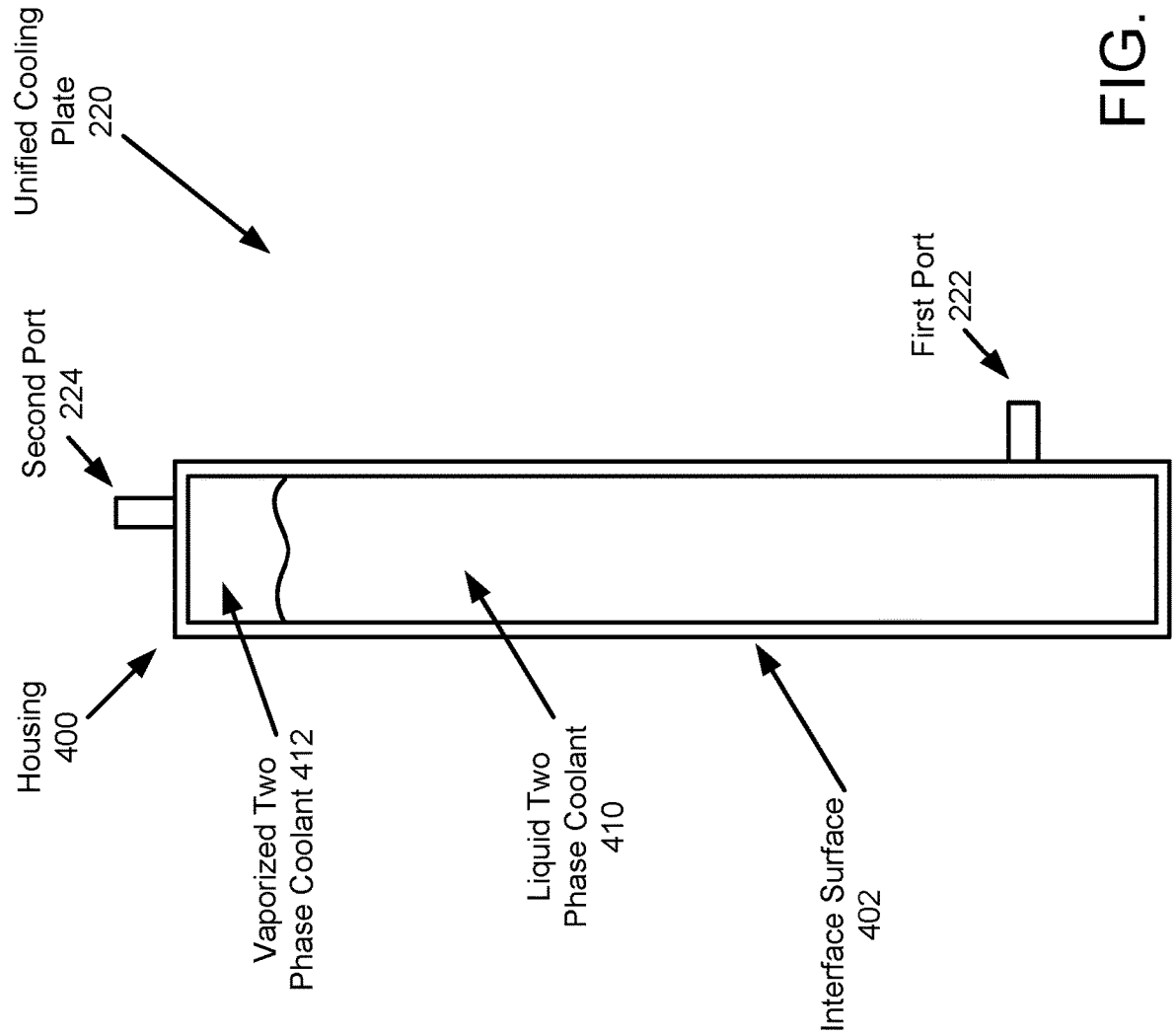
FIG. 4B shows a diagram of a second topology of a unified cooling plate according to one embodiment.

In one or more embodiments, the positions of the ports are selected to facilitate a circulation method used to circulate coolant through these cooling plates. For example, coolant may be pumped, left to circulate naturally with convection, may be gravity assisted in circulation, and/or may be circulated with other methods. The positions, orientations, and other features of the ports may be selected based on the coolant circulation method and/or coolant type (e.g., single or two phase coolant). Refer to FIGS. 4A-4B for additional details regarding port positioning.

As discussed above, cooling device 108 may provide for cooling of a variety of different types of devices. To provide for cooling of different types of devices (e.g., that may have different sizes, positioning with respect to other to-be-cooled devices, cooling requirements, etc.), the configuration of the cooling device as illustrated in FIGS. 2A-2B may be modified to meet the cooling needs of a variety of devices.

Figure 3A:
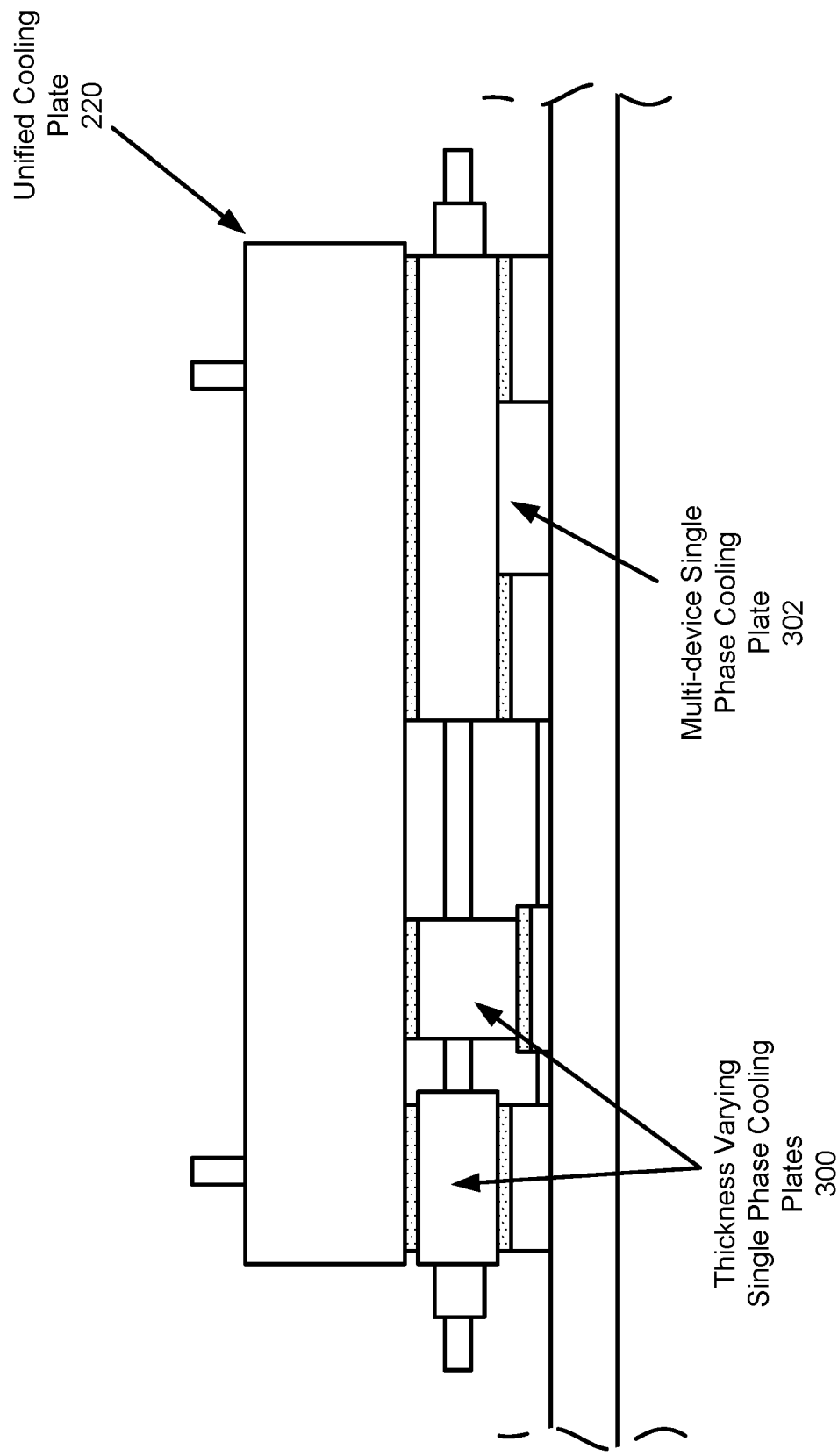
FIG. 3A shows a side view diagram of a first topology of a cooling device according to one embodiment.

Turning to FIG. 3A, a side view diagram of a first configuration of cooling device 108 in accordance with one or more embodiments is shown. The first configuration may include single phase cooling plates 200 that include thickness varying single phase cooling plates 300 and/or a multi-device single phase cooling plate 302. Thickness varying single phase cooling plates 300 may include cooling plates of varying thickness. The thicknesses of the cooling plates may be selected based on the heights or other characteristics of the devices to which the cooling plates will be attached thereby forming a layer of cooling plates that all have a top surface in a plane. By ensuring that all of the cooling plates have a top surface in a plane, a unified cooling plate 220 with a single flat side may be attached to all of the single phase cooling plates. The multi-device single phase cooling plate 302 may have a length and width to span across at least two devices. Such a device may be utilized to reduce the complexity of device attachment when many electronic devices that need to be cooled are packed tightly together.

Figure 3B:
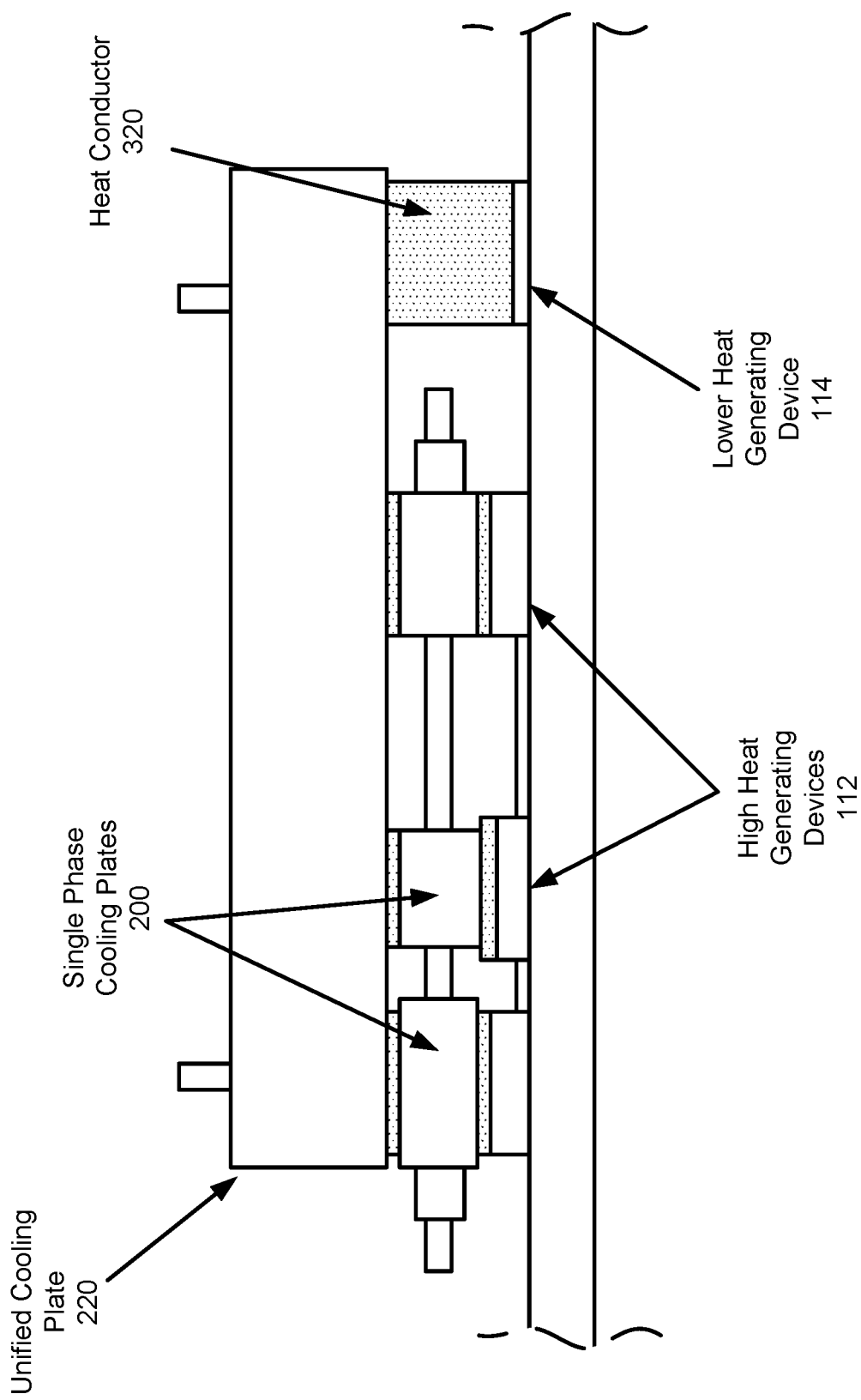
FIG. 3B shows a side view diagram of a second topology of a cooling device according to one embodiment.

Turning to FIG. 3B, a side view diagram of a second configuration of cooling device 108 in accordance with one or more embodiments is shown. The second configuration may include single phase cooling plates 200 that are only disposed on high heat generating devices 112. Unified cooling plate 220 may cover these single phase cooling plates 200 and may also cover one or more lower heat generating devices (e.g., 114, may also be referred to as medium or moderate heat generating devices). Generally, low heat generating devices may generate less heat than high heat generating devices 112. In this manner, unified cooling plate 220 may provide heat dissipation for more devices than single phase cooling plates 200. To facilitate connection of lower heat generating device 114 to unified cooling plate 220, heat conductor 320 may be positioned between these components. Heat conductor 320 may be a part of unified cooling plate 220 and/or may be a separate structure (e.g., an insert, a spacer, a blog of material, etc.) to provide for thermal transport between lower heat generating device 114 and unified cooling plate 220 to facilitate heat dissipation for lower heat generating device 114.

Figure 3C:
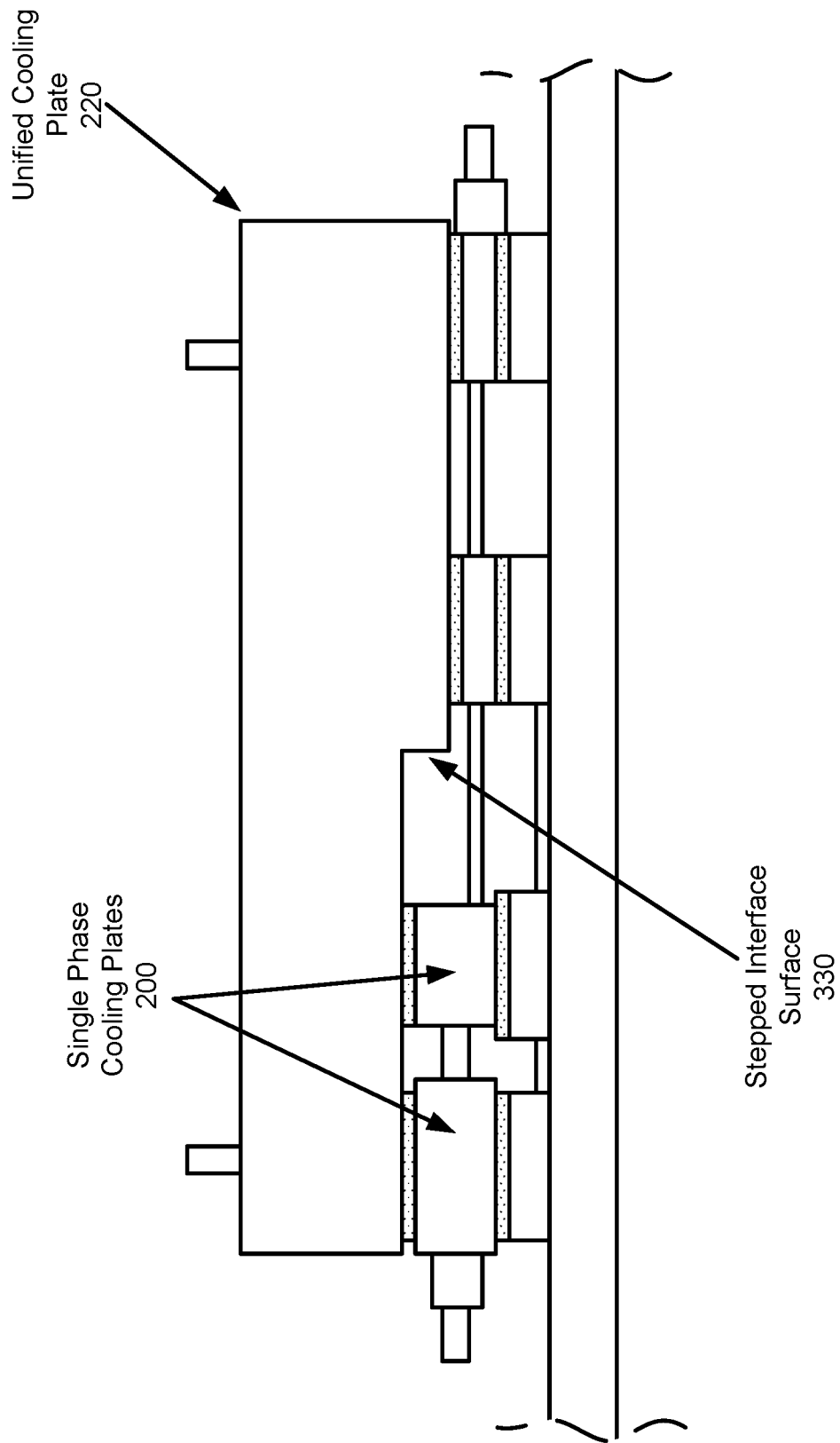
FIG. 3C shows a side view diagram of a third topology of a cooling device according to one embodiment.

Turning to FIG. 3C, a side view diagram of a third configuration of cooling device 108 in accordance with one or more embodiments is shown. The third configuration may include a stepped interface surface 330 of unified cooling plate 220. Due to differences in heights of to-be-cooled components and/or single phase cooling plates 200, a single flat side of unified cooling plate 220 may not be able to be placed on each of single phase cooling plates 200. Stepped interface surface 330 may be a surface of varying heights to facilitate connection between unified cooling plate 220 and singe phase cooling plates 200.

Figure 3D:
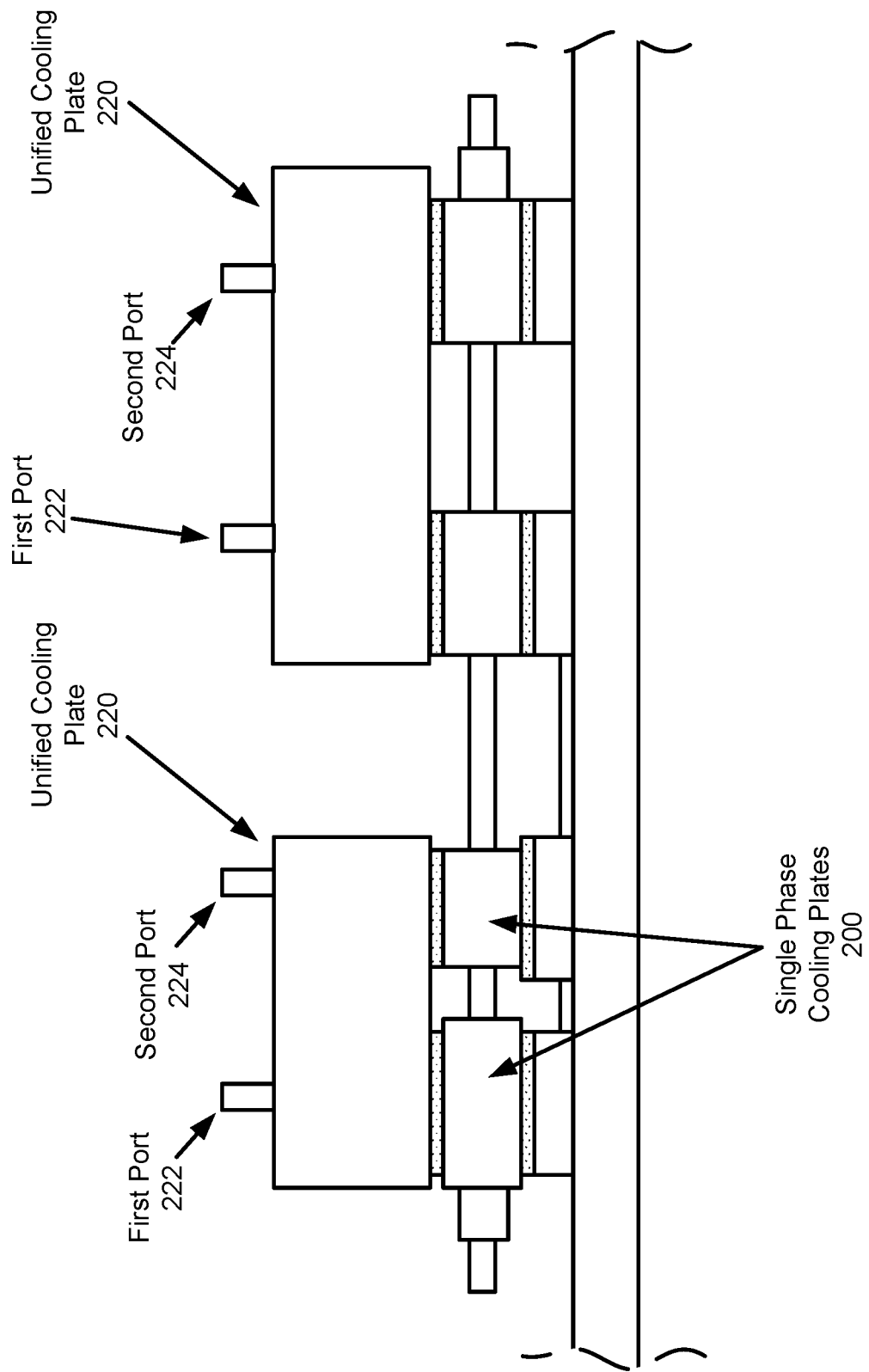
FIG. 3D shows a side view diagram of a fourth topology of a cooling device according to one embodiment.

Turning to FIG. 3D, a side view diagram of a fourth configuration of cooling device 108 in accordance with one or more embodiments is shown. The fourth configuration may include multiple unified cooling plates (e.g., 220) that each are positioned on respective portions of single phase cooling plates 200. In this manner, different coolants may be circulated to different unified cooling plates. For example, single phase coolant may be circulated to some unified cooling plates while two phase coolant is circulated to other unified cooling plates (e.g., while a single coolant is circulated to all of the single phase cooling plates).

The variations illustrated in FIGS. 3A-3D should be understood as being usable separately and/or in combination with one another. Accordingly, a cooling device 108 in accordance with embodiments disclosed herein may include any numbers of instances of any of the features illustrated in FIGS. 1-3D.

As discussed above, two phase coolant is circulated through a unified cooling plate in one or more embodiments disclosed here. FIGS. 4A-4B shows diagrams of unified cooling plate 220 in accordance with one or more embodiments disclosed herein in which a two phase coolant may be circulated.

Turning to FIG. 4A, a first topology of unified cooling plate 220 is illustrated. Unified cooling plate may include housing 400 through which liquid two phase coolant 410 may be circulated. Unified cooling plate 220 may include an interface surface 402 on housing 400. Interface surface 402 may be positioned on single phase cooling plates to enable heat from single phase cooling plates to flow into unified cooling plate 220. For example, if coolant through the single phase cooling plates of a cooling device slows or stops, then the single phase cooling plates may no longer be able to substantially dissipate heat. If the single phase cooling plates are disposed on heat generating devices, then the temperature of the devices and the single phase cooling plates may rise. The rising heat in the single phase cooling plates and heat generating devices may result in a portion of the heat flowing into unified cooling plate 220 where liquid two phase coolant 410 absorbs the heat and vaporizes (at least in part) thereby dissipating the heat from the device and other plates. Vaporized two phase coolant 412 may flow out of unified cooling plate 220 (e.g., through second port 224) to transport the portion of the heat to another device (e.g., second cooling system 130) for dissipation. Liquid two phase coolant 410 may be replenished with additional coolant (e.g., via first port 222).

Turning to FIG. 4B, a second topology of unified cooling plate 220 is illustrated. This second topology may be similar to the first, however, the locations of first port 222 and second port 224 may be modified to facilitate use of this second topology with different topologies of to-be-cooled devices. In a computing environment, various to-be-cooled devices. In a computing environment, various to-be-cooled electronic devices may be placed in various orientations (e.g., rack vs blade container orientations). The placement of the ports on unified cooling plate 220 may be selected to facilitate (i) replenishment of unified cooling plate 220 with coolant and (ii) removal of vaporized coolant. For example, second port 224 may generally be positioned and/or oriented to where vaporized coolant with rise within housing 400 and first port 222 may generally be positioned and/or orientated to fill and/or maintain a fill level of unified cooling plate with liquid two phase coolant 410. While illustrated in FIGS. 4A and 4B in specific locations, ports 222, 224 may be positioned and/or oriented elsewhere without departing from embodiments disclosed herein.

Figure 5:
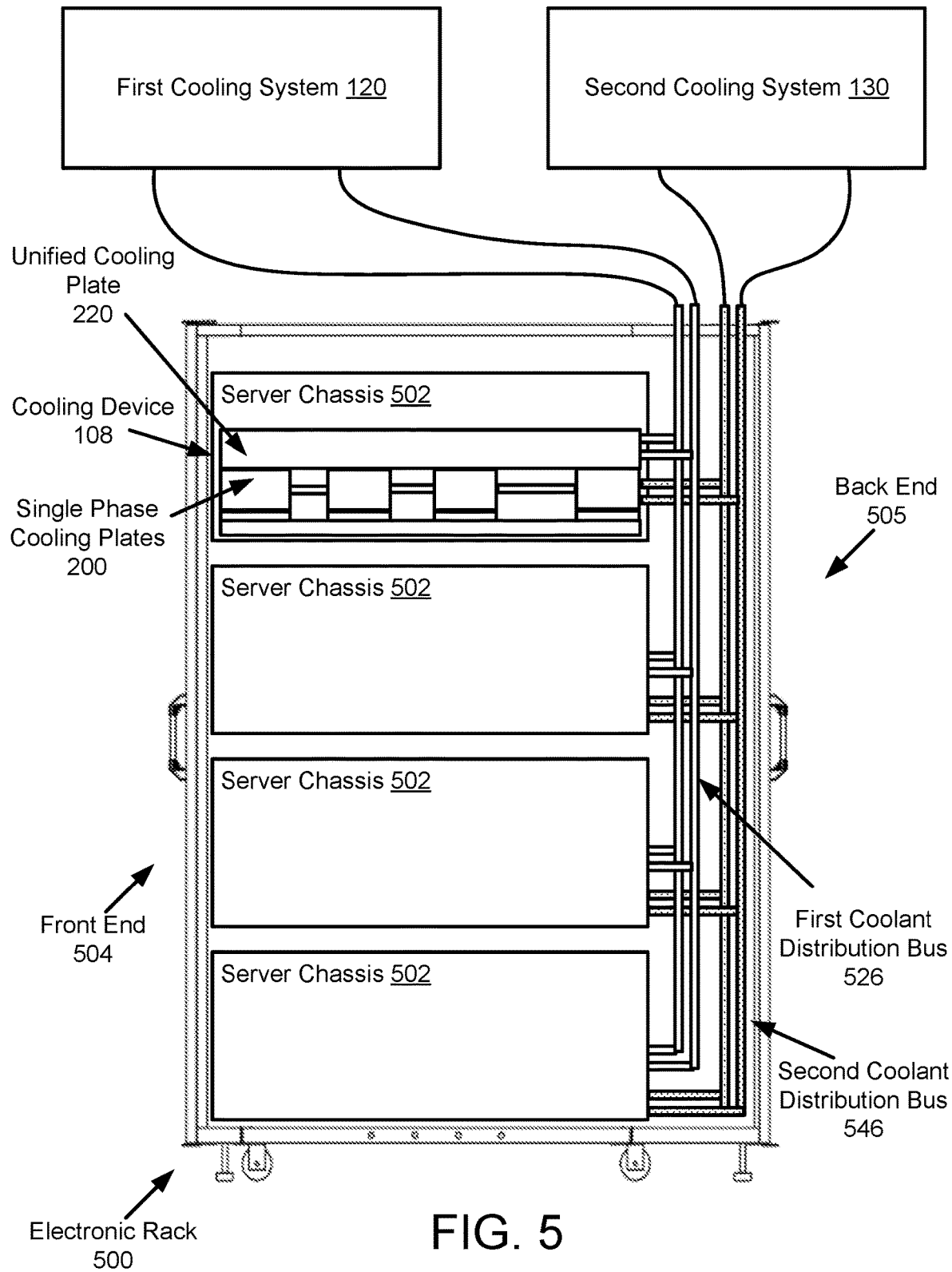
FIG. 5 shows a diagram of an electronic rack according to one embodiment.

As discussed above, cooling device 108 may be used in a computing environment. FIG. 5 is block a diagram illustrating an electronic rack (e.g., part of a computing environment) according to one embodiment. Electronic rack 500 may represent any of the electronic racks as described throughout this application. According to one embodiment, electronic rack 500 includes, but is not limited to, one or more server chassis (collectively referred to as server chassis 502), first coolant distribution bus 526, and second coolant distribution bus 546. Server chassis 502 can be inserted into an array of server slots (e.g., standard shelves) respectively from frontend 504 or backend 505 of electronic rack 500. Note that although there are four server chassis 502 shown here, more or fewer server chassis may be maintained within electronic rack 500. Other electronic racks may accommodate similar or different numbers of server chassis 520. Also note that the particular positions of server chassis 502 are shown for the purpose of illustration only; other arrangements may also be implemented with fewer, additional, and/or different components than those shown here. In one embodiment, electronic rack 500 can be either open to the environment or partially contained by a rack container.

Each of server chassis 502 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 502 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

One or more server chassis 502 may also include cooling device 108. In some embodiments, all server chassis 502 include at least one cooling device 108. The cooling devices disposed in any of server chassis 502 may be in fluid communication with the first coolant distribution bus 526 and/or the second coolant distribution bus 546 to circulate one or more coolants through unified cooling plate 220 and/or single phase cooling plates 200 of the cooling devices (e.g., in any number of server chassis 502).

The coolant distribution buses 526, 546 may be in fluid communication with first cooling system 120 and/or second cooling system 130 to facilitate circulation of coolant from these units/systems to cooling device 108. The coolant distribution buses 526, 546 may include tubes, lines, manifolds, valves, and/or any number and type (e.g., passive and/or active) of devices for managing the formation of fluid flow loops between the cooling systems and the cooling devices. These loops may take various forms and the corresponding cooling systems in the loops may circulate coolant in the loops using a variety of methods. For additional details regarding coolant circulation provided by first cooling system 120 and second cooling system 130, refer to FIGS. 6A-6E.

In one embodiment, electronic rack 500 includes a controller (e.g., a computing device including a processor, memory, storage, and/or communication circuitry that performs one or more functions when the processor executes corresponding instructions (e.g., computer code) stored in the storage or other locations) or other device to monitor operating status of various components within electronic rack 500, such as, for example, server chassis 502. Specifically, the controller may receive operating data from various sensors representing the operating environments of electronic rack 500. For example, the monitor may receive operating data representing temperatures of the processors, coolants, and/or other measurements, which may be captured and collected via various temperature sensors.

Based on the operating data, controller may perform an optimization using a predetermined optimization function or optimization model to derive a set of optimal coolant flow rates or other operating conditions for other components that provide coolant. Once the operating conditions are determined, the controller may provide the operating conditions to the other components. These components may make decisions or otherwise use the operating conditions when selecting how to manage coolant provided to cooling devices.

Note that the rack configuration as shown is described for the purpose of illustration only; other configurations or arrangements may also be applicable without departing from embodiments disclosed herein.

As discussed above, first cooling system 120 and second cooling system 130 may include a variety of different configurations and may pump different types of coolant in different scenarios. FIGS. 6A-6D show block diagrams of these systems in accordance with one or more embodiments disclosed herein.

Figure 6A:
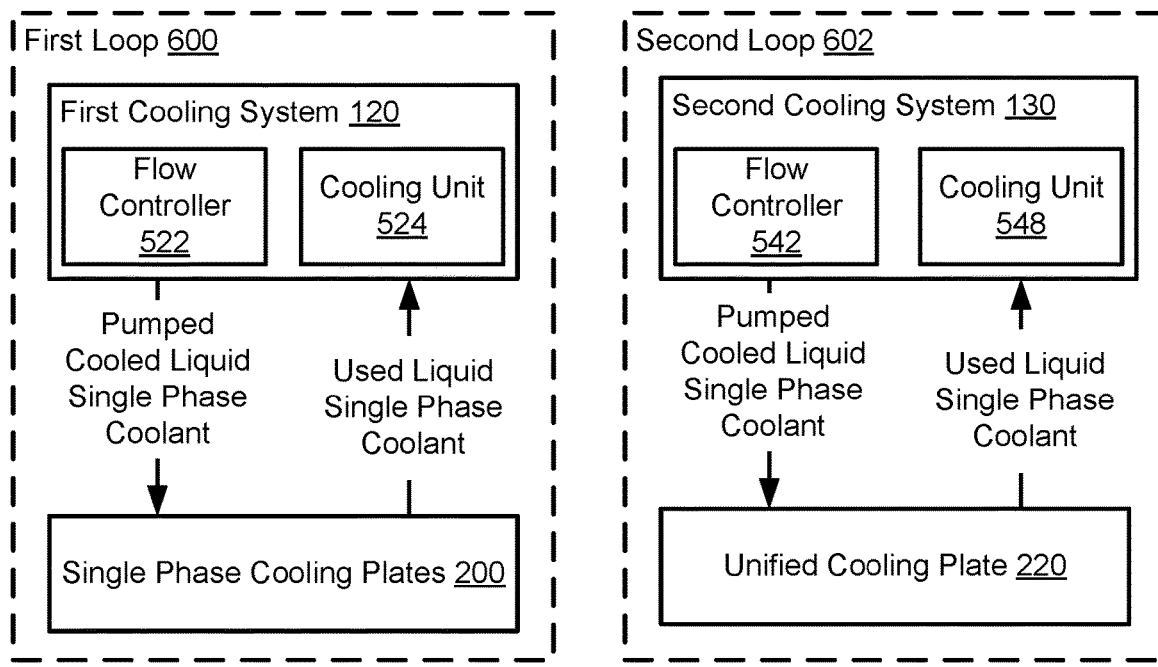
FIG. 6A shows a block diagram of a first topology of a first cooling system and a second cooling system according to one embodiment.

Turning to FIG. 6A, a first topology of first cooling system 120 and second cooling system 130 is shown. The first topology may be used to circulate single phase coolants to both single phase cooling plates and unified cooling plates of one or more cooling devices. In the first topology, first cooling system 120 may include flow controller 522 and cooling unit 524. Flow controller 522 may generally control the flow of a single phase coolant along first loop 600 that includes one or more single phase cooling plates (e.g., via first coolant distribution bus 526 of FIG. 5) which may be part of one or more cooling devices. For example, flow controller 522 may include a pump that pumps cooled liquid single phase coolant along first loop 600 to single phase cooling plates 200. The coolant may circulate through single phase cooling plates 200 and be exhausted as used liquid single phase coolant (e.g., coolant having a raised temperature from the cooled form but still in liquid phase). The used liquid single phase coolant may flow along first loop 600 back to first cooling system 120. Cooling unit 524 may generally chill (or otherwise cool) used liquid single phase coolant to obtain cooled liquid single phase coolant. Cooling unit 524 may dissipate the heat from used liquid single phase coolant into an ambient environment away from the server chassis 502 discussed with respect to FIG. 5. The cooled liquid single phase coolant may be stored in a reservoir until future pumping along first loop 600 or may immediately be pumped back through first loop 600.

Second cooling system 130 may include flow controller 542 and cooling unit 548. Flow controller 542 may generally control the flow of a single phase coolant along second loop 602 that includes one or more unified cooling plates (e.g., via second coolant distribution bus 546 of FIG. 5) which may be part of one or more cooling devices. For example, flow controller 542 may include a pump that pumps cooled liquid single phase coolant along second loop 602 to unified cooling plate 220. The single phase coolant may circulate through unified cooling plate 220 and be exhausted as used liquid single phase coolant (e.g., coolant having a raised temperature from the cooled form but still in liquid phase). The used liquid single phase coolant may flow along second loop 602 back to second cooling system 130. Cooling unit 548 may generally chill (or otherwise cool) used liquid single phase coolant to obtain cooled liquid single phase coolant. Cooling unit 548 may dissipate the heat from used liquid single phase coolant into an ambient environment away from the server chassis 502 discussed with respect to FIG. 5. The cooled liquid single phase coolant may be stored in a reservoir until future pumping along second loop 602 or may immediately be pumped back through second loop 602.

The topology illustrated in FIG. 6A may provide redundancy such that if one coolant circulation slows or stops in one of the loops or is no longer cooled (e.g., due to clogging, a failure of one of first cooling system 120 and second cooling system 130), the other loop may still be able to provide for heat dissipation from the cooling devices connected to it. However, the topology includes redundant components which may be costly.

Figure 6B:
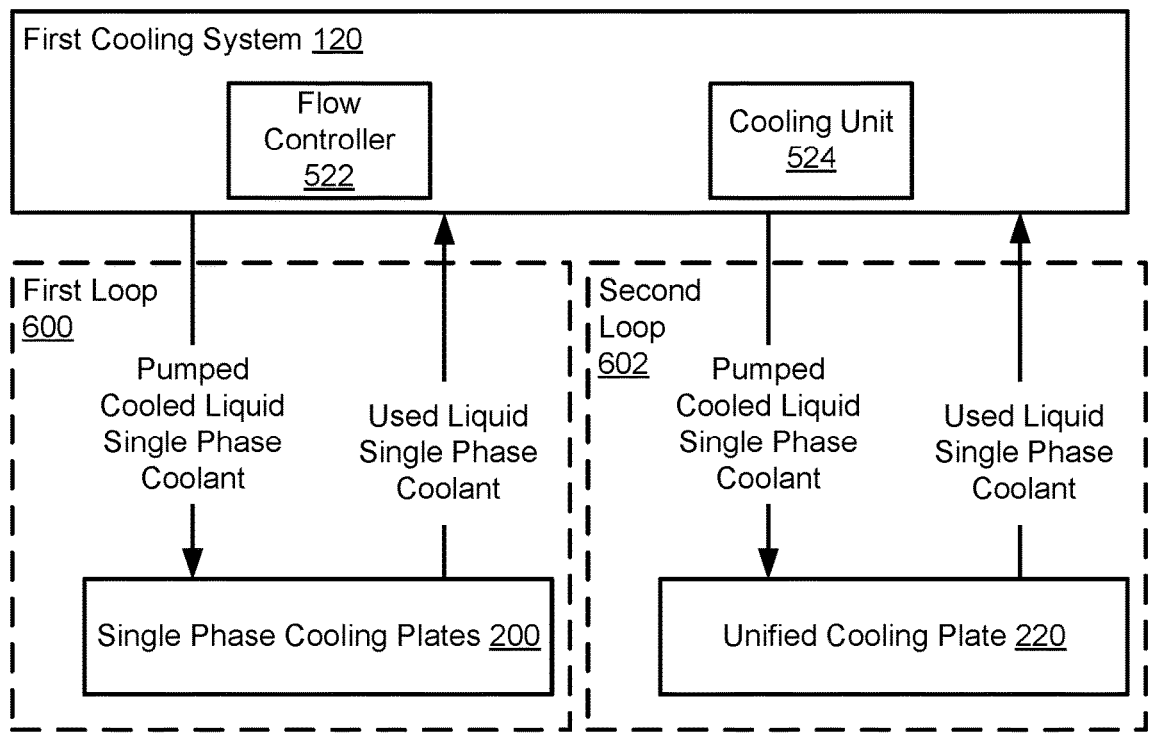
FIG. 6B shows a block diagram of a second topology of a first cooling system according to one embodiment.

Turning to FIG. 6B, a second topology is shown in which first cooling system 120 circulates single phase coolants to both loops there by dissipating heat from both single phase cooling plates 200 and unified cooling plate 220. This topology may be capable of continuing to dissipate heat in the event that one of the loops becomes partially or totally plugged. The other loop may allow for continued heat dissipation for connected cooling devices.

Figure 6C:
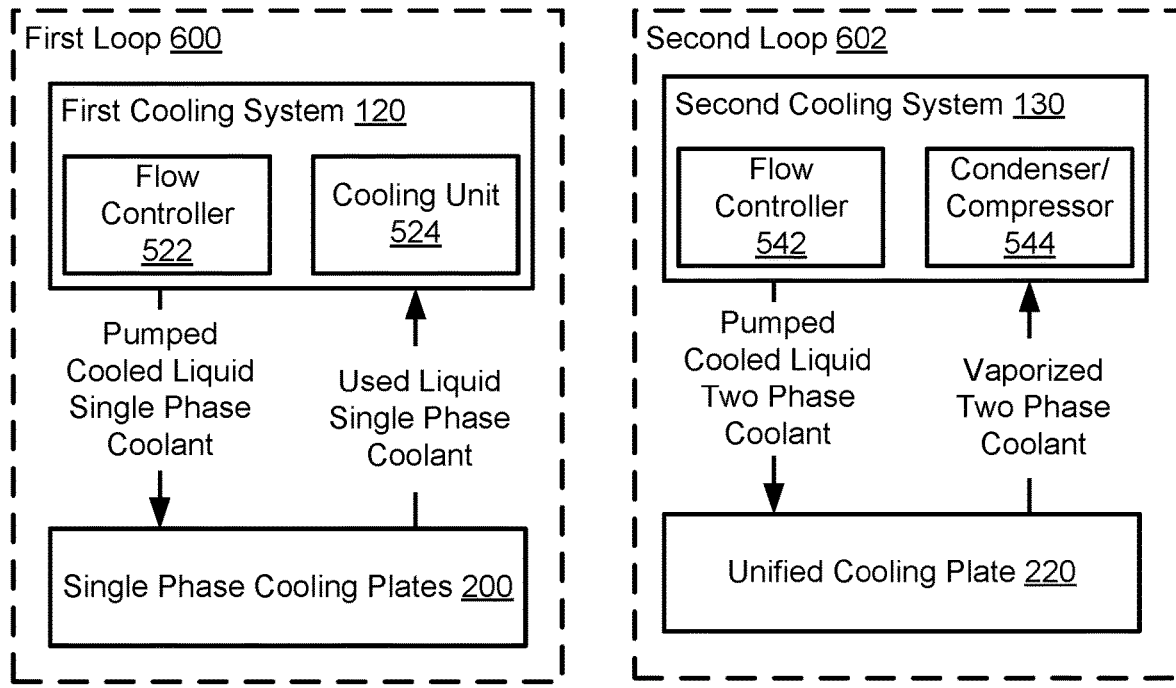
FIG. 6C shows a block diagram of a third topology of a first cooling system and a second cooling system according to one embodiment.

Turning to FIG. 6C, a third topology of first cooling system 120 and second cooling system 130 is shown. The third topology may be used to circulate two different coolants (e.g., a single phase coolant and a two phase coolant) to single phase cooling plates and unified cooling plates of one or more cooling devices. By doing so, the system may be of higher efficiency when compared to a system that only utilizes single phase coolants.

To do so, the first loop 600 and components therein may be similar to those illustrated and described with respect to FIG. 6A. However, second cooling system 130 may circulate a two phase coolant to unified cooling plate 220 rather than single phase coolant. Flow controller 542 may pump cooled liquid two phase coolant to unified cooling plate 220. Once pumped to unified cooling plate 220, a portion of cooled liquid two phase coolant may evaporate and return to second cooling system 130 as vaporized two phase coolant. Rather than including a cooling unit, second cooling system 130 may include (alternatively or in addition to a cooling unit) condenser/compressor 544. Condenser/compressor 544 may condense vaporized two phase coolant to obtain cooled liquid two phase coolant. The cooled liquid two phase coolant may be stored in a reservoir until future pumping along second loop 602 or may immediately be pumped back through second loop 602.

Generally, the third topology may provide redundancy such that a failure of one of the loops may not result in a loss of heat dissipation for the cooling devices. Further, the use of two phase coolant may (i) increased an efficiency by virtue of multiphase heat transfer (e.g., two phase with gas to liquid transition) with condenser/compressor 544 (vs single phase heat transfer with cooling unit 548 in FIGS. 6A and 6B) and (ii) increase tolerance to multi-loop failure. Generally, two phase coolant may be capable of dissipating a larger amount of heat than single phase coolant (e.g., the energy required to vaporize the two phase coolant may be substantially larger than that required to merely increase the temperature of single phase coolant until it is at the temperature of the cooling devices).

Figure 6D:
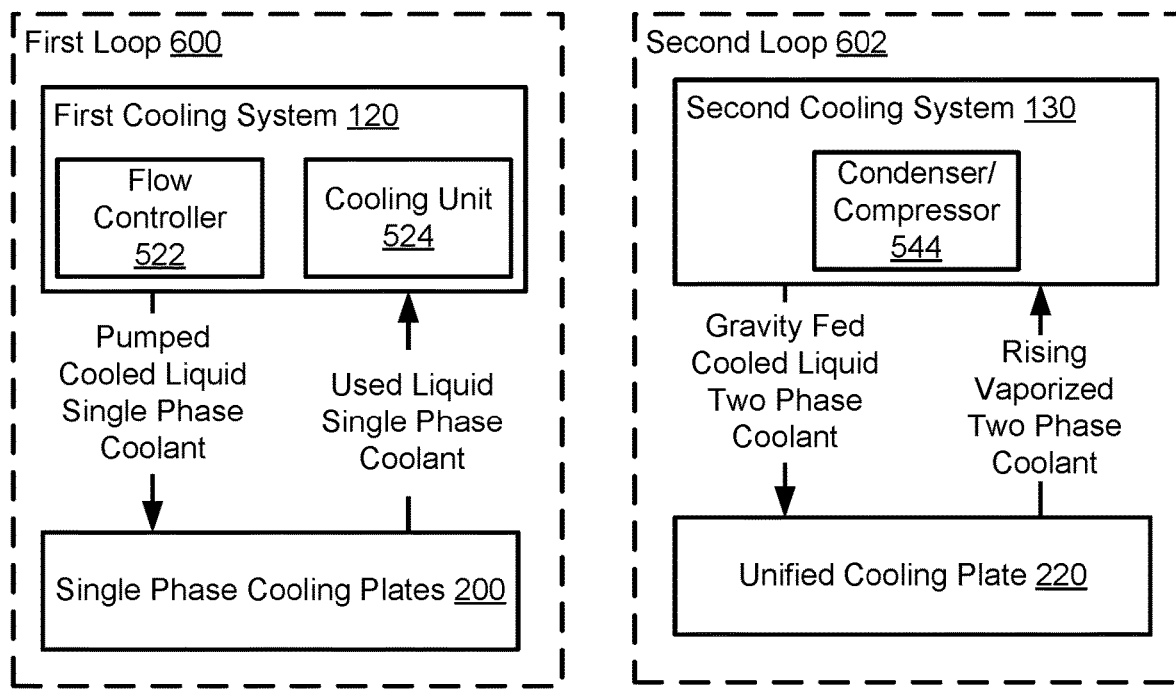
FIG. 6D shows a block diagram of a fourth topology of a first cooling system and a second cooling system according to one embodiment.

Turning to FIG. 6D, a fourth topology of first cooling system 120 and second cooling system 130 is shown. The fourth topology, like the third, may be used to circulate two different coolants (e.g., a single phase coolant and a two phase coolant) to single phase cooling plates and unified cooling plates of one or more cooling devices. However, unlike the third topology, second cooling system 130 may not include flow controller 542. Rather than using an active device for flow control, the fourth topology may utilize natural convection and gravity force to flow two phase coolant through second loop 602. To do so, second cooling system 130 may generally be placed above or at a higher position to unified cooling plate 220. By doing so, cooled liquid two phase coolant may be circulated to unified cooling plate 220 with gravity assistance rather than by a pump. Once some of the cooled liquid two phase coolant is evaporated in unified cooling plate 220, vaporized two phase coolant may rise up and return to second cooling system 130 where condenser/compressor 544 may condense the vapor back into liquid two phase coolant. In this manner, the topology of FIG. 6D may be able to continue to circulate cooled liquid two phase coolant through second loop 602 without a powered pump or other type of active flow controller.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A cooling device, comprising:
    single phase cooling plates to be attached to devices that generate heat when operating, the single phase cooling plates are adapted to dissipate a majority of the heat from the devices when attached to the devices while a first coolant is circulated through the single phase cooling plates; and
    a unified cooling plate disposed on top of the single phase cooling plates, the unified cooling plate is adapted to dissipate a portion of the heat transferred from the single phase cooling plates to the unified cooling plate, the portion of heat dissipated via a second coolant circulated through the unified cooling plate, wherein the second coolant comprises a two phase coolant.

2. The cooling device of claim 1, wherein the single phase cooling plates are connected to one another as a loop with two ports on different ends of the loop.

3. The cooling device of claim 2, wherein the loop and the unified cooling plate are formed as a module.

4. The cooling device of claim 3, wherein the unified cooling plate covers all of the single phase cooling plates, the unified cooling plate is thermally connected to all of the single phase cooling plates, and the unified cooling plate comprises a second loop with two ports.

5. The cooling device of claim 1, further comprising:
    a first cooling system to circulate the first coolant through the single phase cooling plates; and
    a second cooling system to circulate the second coolant through the unified cooling plate.

6. The cooling device of claim 5, wherein the second cooling system is a two phase system, the two phase system is adapted to circulate the two phase coolant through the unified cooling plate by:
    providing a liquid phase of the two phase coolant to the unified cooling plate, and
    receiving a vaporized phase of the two phase coolant from the unified cooling plate.

7. The cooling device of claim 6, further wherein the two phase system comprises a pump that pumps the two phase coolant to the unified cooling plate.

8. The cooling device of claim 6, wherein the two phase system circulates the two phase coolant to the unified cooling plate through natural convection.

9. The cooling device of claim 5, wherein the first coolant is a liquid coolant.

10. The cooling device of claim 1, wherein the unified cooling plate is also attached to other electronics to which the single phase cooling plates are not attached.

11. A server chassis of an electronic rack, comprising:
    one or more electronic devices, representing one or more servers, that generate heat while operating; and
    a cooling device, comprising:
        single phase cooling plates attached to the one or more electronic devices, the single phase cooling plates dissipate a majority of the heat from the one or more electronic devices while a first coolant is circulated through the single phase cooling plates; and
        a unified cooling plate disposed on top of the single phase cooling plates, the unified cooling plate dissipates a portion of the heat transferred from the single phase cooling plates to the unified cooling plate, the portion of heat dissipated via a second coolant circulated through the unified cooling plate, wherein the second coolant comprises a two phase coolant.

12. The server chassis of claim 11, wherein the single phase cooling plates are connected to one another as a loop with two ports on different ends of the loop.

13. The server chassis of claim 12, wherein the loop and the unified cooling plate are formed as a module.

14. The server chassis of claim 13, wherein the unified cooling plate covers all of the single phase cooling plates, the unified cooling plate is thermally connected to all of the single phase cooling plates, and the unified cooling plate comprises a second loop with two ports.

15. The server chassis of claim 11, wherein the unified cooling plate is also attached to other electronics to which the single phase cooling plates are not attached.

16. An electronic rack, comprising:
    a plurality of server chassis arranged in a stack, wherein each of the plurality of server chassis comprises:

one or more electronic devices representing one or more servers, which when operate, generate heat, and a cooling device, comprising:

single phase cooling plates attached to the one or more electronic devices, the single phase cooling plates dissipate a majority of the heat from the one or more electronic devices while a first coolant is circulated through the single phase cooling plates, and a unified cooling plate disposed on top of the single phase cooling plates, the unified cooling plate dissipates a portion of the heat transferred from the single phase cooling plates to the unified cooling plate, the portion of heat dissipated via a second coolant circulated through the unified cooling plate, wherein the second coolant comprises a two phase coolant.

17. The electronic rack of claim 16, wherein the single phase cooling plates are connected to one another as a loop with two ports on different ends of the loop.

18. The electronic rack of claim 17, wherein the loop and the unified cooling plate are formed as a module.

19. The electronic rack of claim 18, wherein the unified cooling plate covers all of the single phase cooling plates, the unified cooling plate is thermally connected to all of the single phase cooling plates, and the unified cooling plate comprises a second loop with two ports.

20. The electronic rack of claim 16, wherein the unified cooling plate is also attached to other electronics to which the single phase cooling plates are not attached.

\* \* \* \* \*